United States Patent
Lv (10) Patent No.: US 11,837,188 B2
(45) Date of Patent: Dec. 5, 2023

(54) GOA CIRCUIT AND DISPLAY PANEL FOR REDUCING THRESHOLD VOLTAGE SHIFT OF TRANSISTOR BY PULLING DOWN SIGNAL DURING BLANK TIME OF SCAN SIGNAL

(71) Applicant: TCL CHINA STAR OPTOELECTRONICS TECHNOLOGY CO., LTD., Shenzhen (CN)

(72) Inventor: Xiaowen Lv, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 513 days.

(21) Appl. No.: 17/050,205

(22) PCT Filed: May 26, 2020

(86) PCT No.: PCT/CN2020/092294
§ 371 (c)(1),
(2) Date: Oct. 23, 2020

(87) PCT Pub. No.: WO2021/184543
PCT Pub. Date: Sep. 23, 2021

(65) Prior Publication Data
US 2023/0154428 A1 May 18, 2023

(30) Foreign Application Priority Data
Mar. 18, 2020 (CN) .................. 202010190039.X (51) Int. Cl.
*G09G 3/32* (2016.01)
*G09G 3/36* (2006.01)
(Continued)

(52) U.S. Cl.
CPC .......... *G09G 3/3677* (2013.01); *G09G 3/3266* (2013.01); *G09G 3/20* (2013.01);
(Continued)

(58) Field of Classification Search
CPC ............... G09G 3/3677; G09G 3/3266; G09G 2300/0408; G09G 2310/0286; G09G 2310/061; G09G 3/20; G11C 19/28
See application file for complete search history.

(56) References Cited

U.S. PATENT DOCUMENTS

| 2010/0214279 | A1 | 8/2010 | Kim |
| 2011/0316833 | A1* | 12/2011 | Chang .................. G09G 3/3677 377/79 |
| 2019/0147824 | A1* | 5/2019 | Lee ...................... G09G 3/3677 345/55 |

FOREIGN PATENT DOCUMENTS

| CN | 101252022 A | 8/2008 |
| CN | 107367876 A | 11/2017 |

(Continued)

*Primary Examiner* — Adam J Snyder
(74) *Attorney, Agent, or Firm* — PV IP PC; Zhigang Ma; Wei Te Chung (57) ABSTRACT

A GOA circuit and a display panel are provided. The GOA circuit includes a plurality of GOA units connected in series. Each GOA unit includes a pull-up control module, a pull-up module, a download module, a pull-down maintaining module, a pull-down module, and a bootstrap capacitor. An AC signal applied to the pull-up module has high and low voltage levels. The high voltage level of the AC signal could reduce the rising time and the falling time of the conventional clock signal such that the output of the scan signal could be better. The low voltage level of the AC signal could pull down the signal in the blank time to perform a stress recovery such that the threshold voltage shift of the transistor caused by the high voltage level stress is reduced. This could raise the stability and the lifetime of the circuit.

15 Claims, 5 Drawing Sheets

(51) Int. Cl.
*G09G 3/3266* (2016.01)
*G09G 3/20* (2006.01)
*G11C 19/28* (2006.01)

(52) U.S. Cl.
CPC .............. *G09G 2300/0408* (2013.01); *G09G 2310/0286* (2013.01); *G09G 2310/061* (2013.01); *G09G 2310/08* (2013.01); *G11C 19/28* (2013.01)

(56) References Cited

FOREIGN PATENT DOCUMENTS

| | | | | |
|---|---|---|---|---|
| CN | 107393473 | A | 11/2017 | |
| CN | 107799087 | A | 3/2018 | |
| CN | 107799088 | A | 3/2018 | |
| CN | 107909980 | A | 4/2018 | |
| CN | 109036316 | A * | 12/2018 | ........... G09G 3/3677 |
| CN | 109036316 | A | 12/2018 | |
| KR | 20110110502 | A | 10/2011 | |

* cited by examiner

GOA CIRCUIT AND DISPLAY PANEL FOR REDUCING THRESHOLD VOLTAGE SHIFT OF TRANSISTOR BY PULLING DOWN SIGNAL DURING BLANK TIME OF SCAN SIGNAL

The present disclosure is a Notional Phase of PCT Patent Application No. PCT/CN2020/092294 having international filing date of May 26, 2020, which claims priority to Chinese Patent Application No. 202010190039.X, filed on Mar. 18, 2020, which is hereby incorporated by reference in its entirety.

FIELD OF THE INVENTION

The present invention relates to a liquid crystal display technical field, and more particularly, to a GOA circuit and a display panel.

BACKGROUND

As the performance improvement of the thin film transistor (TFT), the gate driver on array (GOA) technique is widely used in the display panel. The GOA technique could be used to reduce the number of driver ICs, raise the yield, and meet the demand of the narrow side frame design.

Figure 1:
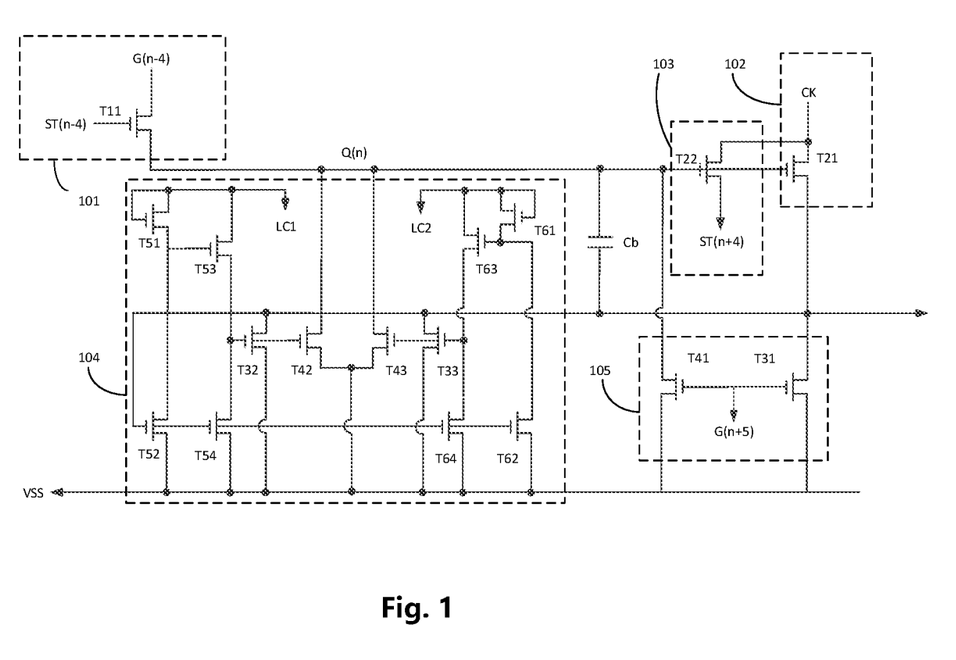
FIG. 1 is a circuit diagram of a conventional GOA circuit.
Figure 2:
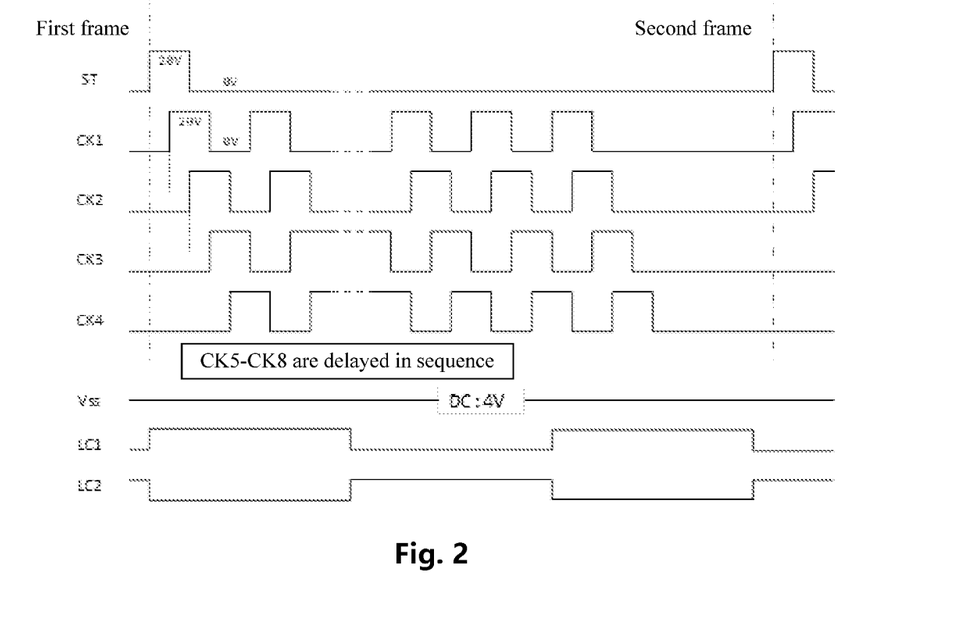
FIG. 2 is a driving timing diagram of the GOA circuit shown in FIG. 1.

Please refer to FIG. 1 in conjunction with FIG. 2. FIG. 1 is a circuit diagram of a conventional GOA circuit. FIG. 2 is a driving timing diagram of the GOA circuit shown in FIG. 1.

As shown in FIG. 1, the conventional GOA circuit comprises: a plurality of GOA units connected in series. The $n^{th}$-stage GOA unit controls the charging operation of the $n^{th}$-stage scan line. Here, n is an integer. The $n^{th}$-stage GOA unit comprises: a pull-up control module 101, a pull-up module 102, a download module 103, a pull-down maintaining module 104, a pull-down module 105, and a bootstrap capacitor Cb. The pull-up control module 101, the pull-up module 102, the download module 103, the pull-down maintaining module 104, the pull-down module 105, and the bootstrap capacitor Cb are all electrically connected to the first node Q(n). Here, G(n−4) is the (n−4)$^{th}$-stage scan signal. G(n) is the $n^{th}$-stage scan signal. G(n+5) is the (n+5)$^{th}$-stage scan signal. ST(n−4) is the (n−4)$^{th}$-stage cascade signal. ST(n+4) is the (n+4)$^{th}$-stage scan signal. VSS is the first voltage signal. CK(n) is the $n^{th}$ clock signal. LC1 is the first oscillation signal. LC2 is the second oscillation signal.

The pull-up module comprises a pull-up transistor T21, which is used to output the scan signal G(n) under the control of the clock signal CK(n). The download module comprises a download transistor T22, which is used to output the cascade signal ST(n+4) under the control of the clock signal CK(n). The pull-down module comprises a first pull-down transistor T31 and a second pull-down transistor T41. The first pull-down transistor T31 is used to pull down the voltage level of the scan signal G(n). The second pull-down transistor T41 is used to pull down the voltage level of the first node Q(n).

As shown in FIG. 2, the frequency of the cascade signal is 80 Hz, which represents that the period is 12.5 ms. The impulse of the cascade signal between frames has, for example, a period of 25 µs and an amplitude of 20V. Within a frame, each of the clock signal CK(n) has 271 s (45 µs). In other words, each of the clock signal CK last for 12155 µs. The clock signal CK is a squire wave. Its high voltage level could be 20V and its low voltage level could be 0V. The time interval between two clock signals CK(n) and CK(n+1) is 1.125 µs. The first voltage signal VSS could be a DC signal of 4V. The first oscillation signal LC1 and the second oscillation signal LC2 are both square waves. LC1 is a reverse signal of LC2 and the period of the square wave is 2.5 s.

In the conventional GOA circuit, the pull-up transistor T21, used as the output transistor, needs to drive the entire scan line (Gate) and to achieve the corresponding falling time. Therefore, the transistor needs to have a large size. Furthermore, the pull-up transistor T21 is directly connected to the clock signal line as a load. This makes the capacitance of the clock signal line large. The current on the clock signal line is determined by its resistance and capacitance. The formula is as below:

$$I_C = C \frac{dV_B}{dt}$$

$$X_C = \Delta t / C$$

$$X_C = \frac{1}{WC} = 1/2\pi fC$$

$$I = (V_2 - V_1)/(R + X_C)$$

When the capacitance becomes larger, the current on the clock signal line becomes larger as well. This generates heats on the clock signal line. This issue becomes more severe in the products with high resolution or high refreshing frequency. The heating issue is a deadly problem for a GOA circuit. It will decrease the lifetime of the components and may introduce accidents.

Therefore, a new GOA circuit for an LCD panel is required to solve the above issue.

SUMMARY

Technical Solution

One objective of an embodiment of the present invention is to provide a GOA circuit and a display panel to avoid the heating problem caused by the large capacitance of the clock signal line so as to raise the stability and lifetime of the circuit.

According to an embodiment of the present invention, a gate driver on array (GOA) circuit is disclosed. The GOA circuit comprises a plurality of GOA units connected in series. An $n^{th}$-stage GOA unit controls a charging operation of an $n^{th}$-stage scan line. The $n^{th}$-stage GOA unit comprises: a pull-up control module, electrically connected to a first node Q(n), configured to receive a (n−p)$^{th}$-stage scan signal G(n−p) and a (n−p)$^{th}$-stage cascade signal ST(n−p) and to pull down or pull up a voltage level of the first node Q(n); wherein n and p are integers and n is larger than p; a pull-up module, electrically connected to the first node Q(n), configured to receive an AC signal Vnew and output a $n^{th}$-stage scan signal G(n), wherein a frequency of the AC signal Vnew is less than or equal to a predetermined frequency; a download module, electrically connected to the first node Q(n), configured to receive the AC signal Vnew and output a (n+p)$^{th}$-stage cascade signal ST(n+p); a pull-down maintaining module, electrically connected to the first node Q(n), configured to receive a first voltage signal VSS, an oscillation signal and the nth-stage scan signal G(n) and to maintain a low voltage level of the first node Q(n); a pull-down module, electrically connected to the first node Q(n), configured to receive the first voltage signal VSS and a (n+p+1)$^{th}$-stage scan signal G(n+p+1) and to pull down a voltage level of the first node Q(n) and a voltage level of the nth-stage scan signal G(n); and a bootstrap capacitor, electrically connected to the first node Q(n), configured to receive the n$^{th}$ stage scan signal G(n).

Optionally, the GOA circuit, the AC signal Vnew is a square wave.

Optionally, a first voltage level of the square wave is 28V and a second voltage level of the square wave is −28V, and the second voltage level corresponds a blank time of a scan signal.

Optionally, the pull-up control module comprises a control transistor, having a gate receiving the (n−p)$^{th}$-stage cascade signal ST(n−p), a first electrode receiving the (n−p)$^{th}$-stage scan signal G(n−p), and a second electrode electrically connected to the first node Q(n).

Optionally, the pull-up module comprises a pull-up transistor having a gate electrically connected to the first node Q(n), a first electrode receiving the AC signal Vnew, and a second electrode outputting the n$^{th}$-stage scan signal G(n).

Optionally, the download module comprises a download transistor, having a gate electrically connected to the first node Q(n), a first electrode receiving the AC signal Vnew, and a second electrode outputting the (n+p)$^{th}$-stage cascade signal ST(n+p).

Optionally, the pull-down maintaining module comprises: a first maintaining unit, electrically connected to the first node Q(n), configured to receive the first oscillation signal LC1, the first voltage signal VSS and the n$^{th}$-stage scan signal G(n); and a second maintaining unit, electrically connected to the first node Q(n), configured to receive a second oscillation signal LC2, the first voltage level signal VSS and the n$^{th}$-stage scan signal G(n). The oscillation signal comprises the first oscillation signal and the second oscillation signal.

Optionally, the first oscillation signal LC1 and the second oscillation signal LC2 are both square waves and the first oscillation signal LC1 is a reverse signal of the second oscillation signal LC2.

Optionally, the pull-down module comprises: a first pull-down transistor, having a gate receiving the (n+p+1)$^{th}$-stage scan signal G(n+p+1), a first electrode configured to pull down a voltage level of the n$^{th}$-stage scan signal G(n) and a second electrode receiving the first voltage level VSS; and a second pull-down transistor, having a gate receiving the (n+p+1)$^{th}$-stage scan signal G(n+p+1), a first electrode configured to pull down a voltage level of the first node Q(n) and a second electrode receiving the first voltage level VSS.

According to an embodiment of the present invention, a display panel is disclosed. The display panel comprises an array substrate, comprising a GOA circuit. The GOA circuit comprises a plurality of GOA units connected in series. An n$^{th}$-stage GOA unit controls a charging operation of an n$^{th}$-stage scan line. The n$^{th}$-stage GOA unit comprises: a pull-up control module, electrically connected to a first node Q(n), configured to receive a (n−p)$^{th}$-stage scan signal G(n−p) and a (n−p)$^{th}$-stage cascade signal ST(n−p) and to pull down or pull up a voltage level of the first node Q(n); wherein n and p are integers and n is larger than p; a pull-up module, electrically connected to the first node Q(n), configured to receive an AC signal Vnew and output a n$^{th}$-stage scan signal G(n), wherein a frequency of the AC signal Vnew is less than or equal to a predetermined frequency; a download module, electrically connected to the first node Q(n), configured to receive the AC signal Vnew and output a (n+p)$^{th}$-stage cascade signal ST(n+p); a pull-down maintaining module, electrically connected to the first node Q(n), configured to receive a first voltage signal VSS, an oscillation signal and the nth-stage scan signal G(n) and to maintain a low voltage level of the first node Q(n); a pull-down module, electrically connected to the first node Q(n), configured to receive the first voltage signal VSS and a (n+p+1)$^{th}$-stage scan signal G(n+p+1) and to pull down a voltage level of the first node Q(n) and a voltage level of the nth-stage scan signal G(n); and a bootstrap capacitor, electrically connected to the first node Q(n), configured to receive the n$^{th}$ stage scan signal G(n).

Optionally, the GOA circuit, the AC signal Vnew is a square wave.

Optionally, a first voltage level of the square wave is 28V and a second voltage level of the square wave is −28V, and the second voltage level corresponds a blank time of a scan signal.

Optionally, the pull-up control module comprises a control transistor, having a gate receiving the (n−p)$^{th}$-stage cascade signal ST(n−p), a first electrode receiving the (n−p)$^{th}$-stage scan signal G(n−p), and a second electrode electrically connected to the first node Q(n).

Optionally, the pull-up module comprises a pull-up transistor having a gate electrically connected to the first node Q(n), a first electrode receiving the AC signal Vnew, and a second electrode outputting the n$^{th}$-stage scan signal G(n).

Optionally, the download module comprises a download transistor, having a gate electrically connected to the first node Q(n), a first electrode receiving the AC signal Vnew, and a second electrode outputting the (n+p)$^{th}$-stage cascade signal ST(n+p).

Optionally, the pull-down maintaining module comprises: a first maintaining unit, electrically connected to the first node Q(n), configured to receive the first oscillation signal LC1, the first voltage signal VSS and the n$^{th}$-stage scan signal G(n); and a second maintaining unit, electrically connected to the first node Q(n), configured to receive a second oscillation signal LC2, the first voltage level signal VSS and the n$^{th}$-stage scan signal G(n). The oscillation signal comprises the first oscillation signal and the second oscillation signal.

Optionally, the first oscillation signal LC1 and the second oscillation signal LC2 are both square waves and the first oscillation signal LC1 is a reverse signal of the second oscillation signal LC2.

Optionally, the pull-down module comprises: a first pull-down transistor, having a gate receiving the (n+p+1)$^{th}$-stage scan signal G(n+p+1), a first electrode configured to pull down a voltage level of the n$^{th}$-stage scan signal G(n) and a second electrode receiving the first voltage level VSS; and a second pull-down transistor, having a gate receiving the (n+p+1)$^{th}$-stage scan signal G(n+p+1), a first electrode configured to pull down a voltage level of the first node Q(n) and a second electrode receiving the first voltage level VSS.

Advantageous Effect

In contrast to the conventional art, the GOA circuit according to an embodiment of the present invention reduces the size of the pull-up transistor. The load and the current of the clock signal line become smaller and thus alleviate the heating problem. In addition, an AC signal is used to replace the conventional clock signal. The AC signal comprises high/low voltage signals, where one is the reverse signal of the other. The high voltage level of the AC signal could reduce the rising time and the falling time of the conventional clock signal such that the output of the scan signal could be better. The low voltage level of the AC signal could pull down the signal in the blank time to perform a stress recovery such that the threshold voltage shift of the transistor caused by the high voltage level stress is reduced. This could raise the stability and the lifetime of the circuit.

DETAILED DESCRIPTION OF PREFERRED EMBODIMENTS

The present disclosure provides a GOA circuit and a display panel having the GOA circuit. For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

In the following disclosure, a GOA circuit of an embodiment of the present invention is illustrated with FIGS. 3-5.

Figure 3:
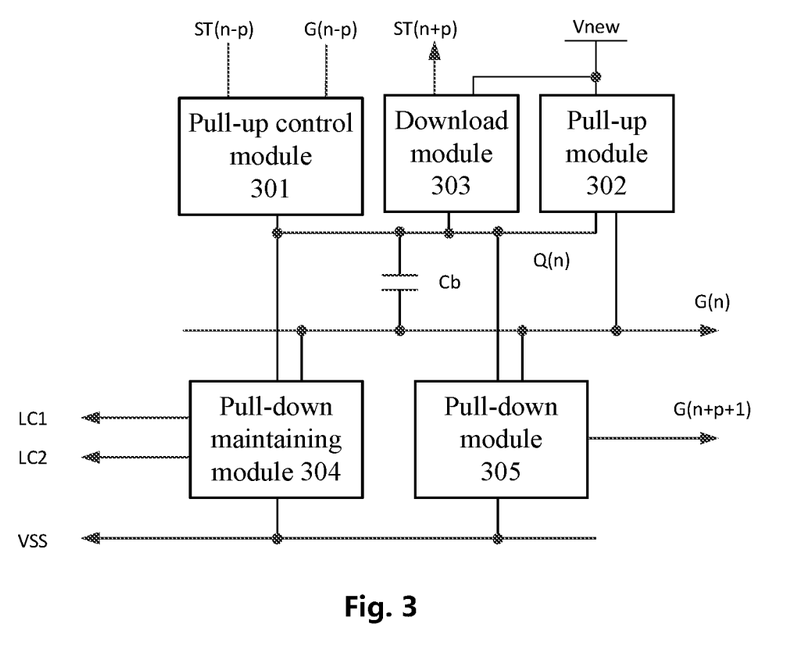
FIG. 3 is a diagram of a GOA circuit according to an embodiment of the present invention.

Please refer to FIG. 3. FIG. 3 is a diagram of a GOA circuit according to an embodiment of the present invention. As shown in FIG. 3, a GOA circuit of an embodiment is disclosed. The GOA circuit comprises a plurality of GOA units connected in series. The $n^{th}$-stage GOA unit controls a charging operation of the $n^{th}$-stage scan line. The $n^{th}$-stage GOA unit comprises: a pull-up control module 301, a pull-up module 302, a download module 303, a pull-down maintaining module 304, a pull-down module 305 and a bootstrap capacitor Cb.

The pull-up control module 301 is electrically connected to a first node Q(n). The pull-up control module 301 is configured to receive a $(n-p)^{th}$-stage scan signal G(n−p) and a $(n-p)^{th}$-stage cascade signal ST(n−p) and to pull down or pull up a voltage level of the first node Q(n). Here, n and p are integers and n is larger than p.

The pull-up module 302 is electrically connected to the first node Q(n). The pull-up module 302 is configured to receive an AC signal Vnew and output a nth-stage scan signal G(n) under the control of the pull-up control signal Q(n). The frequency of the AC signal Vnew is less than or equal to a predetermined frequency. That is, the AC signal Vnew is a low-frequency AC signal.

The download module 303 is electrically connected to the first node Q(n). The download module 303 is configured to receive the AC signal Vnew and output a (n+p)th-stage cascade signal ST(n+p) under the control of the voltage level of the first node Q(n).

The pull-down maintaining module 304 is electrically connected to the first node Q(n). The pull-down maintaining module 304 is configured to receive a first voltage signal VSS, an oscillation signal and the nth-stage scan signal G(n) and to maintain a low voltage level of the first node Q(n). The oscillation signal comprises the first oscillation signal LC1 and the second oscillation signal LC2. The timing of the LC1 and the LC2 could be referred to FIG. 2.

The pull-down module 305 is electrically connected to the first node Q(n). The pull-down module is configured to receive the first voltage signal VSS and a $(n+p+1)^{th}$-stage scan signal G(n+p+1) and to pull down the voltage level of the nth-stage scan signal G(n) and the voltage level of the first node Q(n) under the control of the $(n+p+1)^{th}$-stage scan signal G(n+p+1); and The bootstrap capacitor Cb is electrically connected to the first node Q(n). The bootstrap capacitor Cb is configured to receive the $n^{th}$-stage scan signal G(n) and to raise and maintain the voltage level of the first node Q(n) in the output phase of the $n^{th}$-stage scan signal G(n).

Figure 4:
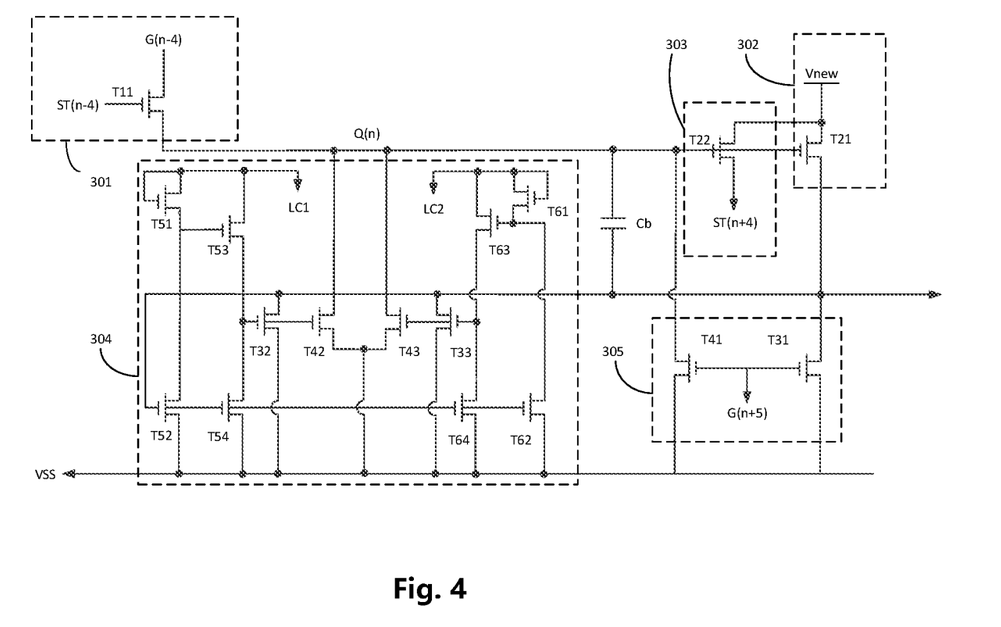
FIG. 4 is a circuit diagram of a GOA circuit according to an embodiment of the present invention.

Please refer to FIG. 4. FIG. 4 is a circuit diagram of a GOA circuit according to an embodiment of the present invention. As shown in FIG. 4, the $n^{th}$-stage GOA unit in the GOA circuit comprises a pull-up control module 301, a pull-up module 302, a download module 303, a pull-down maintaining module 304, a pull-down module 305 and a bootstrap capacitor Cb. In this embodiment, p is 4. However, the value of n is only an example, not a limitation of the present invention.

The pull-up control module 301 comprises a control transistor T11. The gate of the control transistor T11 having a gate receiving the $(n-p)^{th}$-stage cascade signal ST(n−p), a first electrode receiving the $(n-p)^{th}$-stage scan signal G(n−p), and a second electrode electrically connected to the first node Q(n). Specifically, the control transistor T11 could be implemented with an N-type TFT. The drain of the N-type TFT is the first electrode and the source of the N-type TFT is the second electrode.

The pull-up module 302 comprises a pull-up transistor T21, having a gate electrically connected to the first node Q(n), a first electrode receiving the AC signal Vnew, and a second electrode outputting the $n^{th}$-stage scan signal G(n). Specifically, the pull-up transistor T21 could be implemented with an N-type TFT. The drain of the N-type TFT is the first electrode and the source of the N-type TFT is the second electrode.

The download module 303 comprises a download transistor T22, having a gate electrically connected to the first node Q(n), a first electrode receiving the AC signal Vnew, and a second electrode outputting the $(n+p)^{th}$-stage cascade signal ST(n+p). Specifically, the download transistor T22 could be implemented with an N-type TFT. The drain of the N-type TFT is the first electrode and the source of the N-type TFT is the second electrode.

The pull-down maintaining module 304 comprises: a first maintaining unit and a second maintaining unit. The first maintaining unit and the second maintaining unit have the same structure and are symmetrically positioned.

The first maintaining unit comprises a first transistor T32, a second transistor T42, a third transistor T51, a fourth transistor T52, a fifth transistor T53 and a sixth transistor T54. Specifically, the above-mentioned transistors could be implemented with N-type TFTs. The drains are the first electrodes and the sources are the second electrodes.

Here, the gate of the first transistor T32 is electrically connected to the gate of the second transistor T42. The drain of the first transistor T31 is used to receive the $n^{th}$-stage scan signal G(n) and the drain of the first transistor T31 is used to receive the first voltage signal VSS. The drain of the second transistor T42 is electrically connected to the first node Q(n) and the source of the second transistor T42 is used to receive the first voltage signal VSS. The gate and the drain of the third transistor T51 are used to receive the first oscillation signal LC1 and the source of the third transistor T51 is electrically connected to the source of the fourth transistor T52. The gate of the fourth transistor T52 is used to receive the $n^{th}$-stage scan signal G(n) and the drain of the fourth transistor T52 is used to receive the first voltage signal VSS. The gate of the fifth transistor T53 is electrically connected to the source of the third transistor T51. The drain of the fifth transistor T53 is used to receive the first oscillation signal LC1. The source of the fifth transistor T53 is electrically connected to the gate of the first transistor T32. The gate of the sixth transistor T54 is used to receive $n^{th}$-stage scan signal G(n). The drain of the sixth transistor T54 is electrically connected to the gate of the first transistor T32. The source of the sixth transistor T54 is used to receive the first voltage signal VSS.

The second maintaining unit comprises: a seventh transistor T33, an eighth transistor T43, a ninth transistor T61, a tenth transistor T62, an eleventh transistor T63 and a twelfth transistor T64. Specifically, the above-mentioned transistors could be implemented with N-type TFTs. The drains are the first electrodes and the sources are the second electrodes.

Here, the gate of the seventh transistor T33 is electrically connected to the gate of the eighth transistor T43. The drain of the seventh transistor T33 is used to receive the $n^{th}$-stage scan signal G(n) and the source of the seventh transistor T33 is used to receive the first voltage signal VSS. The drain of the eighth transistor T43 is electrically connected to the first node Q(n). The source of the eighth transistor T43 is used to receive the first voltage signal VSS. The gate and the drain of the ninth transistor T61 are used to receive the second oscillation signal LC2. The source of the ninth transistor T61 is electrically connected to the drain of the tenth transistor T62. The gate of the tenth transistor T62 is used to receive the $n^{th}$-stage scan signal G(n). The source of the tenth transistor T62 is used to receive the first voltage signal VSS. The gate of the eleventh transistor T63 is electrically connected to the source of the ninth transistor T61. The drain of the eleventh transistor T63 is used to receive the first oscillation signal LC2. The source of the eleventh transistor T63 is electrically connected to the gate of the seventh transistor T33. The gate of the twelfth transistor T64 is used to receive the $n^{th}$-stage scan signal G(n). The drain of the twelfth transistor T64 is electrically connected to the gate of the seventh transistor T33. The source of the twelfth transistor T64 is used to receive the first voltage signal VSS.

The pull-down module 305 comprises a first pull-down transistor T31, having a gate receiving the $(n+5)^{th}$-stage scan signal G(n+5), a first electrode configured to pull down a voltage level of the $n^{th}$-stage scan signal G(n) and a second electrode receiving the first voltage level VSS; and a second pull-down transistor, having a gate receiving the $(n+5)^{th}$-stage scan signal G(n+5), a first electrode configured to pull down a voltage level of the first node Q(n) and a second electrode receiving the first voltage level VSS. Specifically, the first transistor T31 and the second transistor T41 are both implemented with N-type TFTs. The drains are the first electrodes and the sources are the second electrodes.

Figure 5:
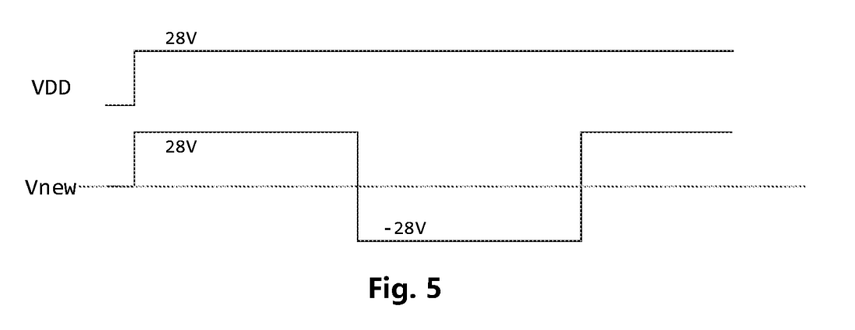
FIG. 5 is a timing diagram of an AC signal in the GOA circuit shown in FIG. 4.

Please refer to FIG. 5. FIG. 5 is a timing diagram of an alternating current (AC) signal in the GOA circuit shown in FIG. 4. As shown in FIG. 5, the pull-up module 302 and the download module 303 receive the AC signal Vnew, which is used to replace the conventional clock signal CK. The AC signal Vnew is a low-frequency AC signal and its high/low signals have reversed phases. When the AC signal Vnew corresponds to a high voltage level, the pull-up transistor T21 in the pull-up module 302 could be turned on according to the first node Q(n). This reduces the rising time and the falling time of the conventional clock signal CK and thus introduces a better output of the scan signal. Furthermore, when the AC signal Vnew corresponds to a low voltage level, the low voltage level could pull down the signal during the blank time of the scan signal so as to perform the stress recovery. This could reduce the threshold voltage shift of the transistor caused by the stress introduced by the high voltage level. This could raise the stability and the lifetime of the circuit. The oscillation signal is a squire wave. The first voltage level of the square wave is 28V and the second voltage level of the square wave is −28V. The second voltage level corresponds to the blank time of the display panel.

In contrast, the DC signal VDD is used to replace the conventional clock signal CK as the input signal for the pull-up module 302 and the download module 303. Because the pull-up transistor T21 of the pull-up module 302 receives the DC signal VDD, the effect is similar to the effect when the high voltage level of the AC signal Vnew is used. The pull-up transistor T21 could be turned on according to the first node Q(n). This could reduce the rising time and falling time of the conventional clock signal CK and obtains a better output of the scan signal. In addition, because the first pull-down transistor T31 of the pull-down module is used to pull down the signal, the size of the pull-up transistor T21 could be reduced. Furthermore, because the first pull-down transistor T31 is not the load of the clock signal line, this means that the load and the current of the clock signal line are reduced. Moreover, the frequency becomes 0 from 60 Hz/120 Hz. This reduces the power consumption and thus reduces the generated heats. However, because the pull-up transistor T21 receives the DC signal VDD for a long time, this makes the threshold voltage shift more severe. This also reduces the reliability and the lifetime of the circuit.

In this embodiment, the GOA circuit uses the pull-down module to pull down the signal. This allows the size of the pull-up transistor T21 to be reduced. In addition, the pull-down module is not the load of the clock signal line such that the load of the clock signal line is reduced. The current is also reduced such that the heating issue could be alleviated. In addition, the AC signal is replaced with the conventional clock signal as an input signal for the pull-down module and the pull-up module and the AC signal comprises high/low voltage signals having reversed phases. Therefore, when the AC signal corresponds to the high voltage level, the pull-up transistor T21 in the pull-up module could be turned on according to the first node. This reduces the rising time and the falling time of the conventional clock signal such that the output of the scan signal becomes better. Furthermore, the low voltage level of the AC signal could pull down the signal during the blank time of the scan signal so as to perform the stress recovery. This could reduce the threshold voltage shift of the transistor caused by the stress introduced by the high voltage level. This could raise the stability and the lifetime of the circuit.

The first oscillation signal LC1 and the second oscillation signal LC2 are both square waves and the first oscillation signal LC1 is a reverse signal of the second oscillation signal LC2.

Figure 6:
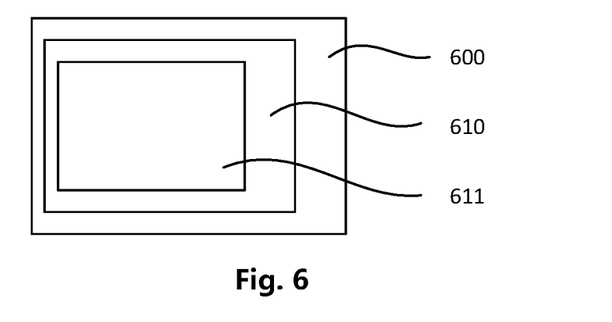
FIG. 6 is a diagram of a display panel according to an embodiment of the present invention.

A display panel is further disclosed. Please refer to FIG. 6. FIG. 6 is a diagram of a display panel according to an embodiment of the present invention. As shown in FIG. 6, the display panel 600 comprises an array substrate 610. The array substrate 610 comprises the above-mentioned GOA circuit 611.

The display panel 600 could be an LCD panel or an OLED display panel.

From the above, the display panel including the above-mentioned GOA circuit could alleviate the heating issue. In addition, the high voltage level of the AC signal could control the pull-up transistor to be turned on according to the first node. This reduces the rising time and the falling time of the conventional clock signal such that the output of the scan signal becomes better. Furthermore, the low voltage level of the AC signal could pull down the signal during the blank time of the scan signal so as to perform the stress recovery. This could reduce the threshold voltage shift of the transistor caused by the stress introduced by the high voltage level. This could raise the stability and the lifetime of the circuit.

Above are embodiments of the present invention, which does not limit the scope of the present invention. Any modifications, equivalent replacements or improvements within the spirit and principles of the embodiment described above should be covered by the protected scope of the invention.

What is claimed is:

1. A gate driver on array (GOA) circuit, comprising a plurality of GOA units connected in series, wherein an $n^{th}$-stage GOA unit controls a charging operation of an $n^{th}$-stage scan line, the $n^{th}$-stage GOA unit comprises:
   a pull-up control module, electrically connected to a first node Q(n), configured to receive a $(n-p)^{th}$-stage scan signal G(n-p) and a $(n-p)^{th}$-stage cascade signal ST(n-p) and to pull down or pull up a voltage level of the first node Q(n), wherein n and p are integers and n is larger than p;
   a pull-up module, electrically connected to the first node Q(n), configured to receive an alternating current (AC) signal Vnew and output a $n^{th}$-stage scan signal G(n), wherein a frequency of the AC signal Vnew is less than or equal to a predetermined frequency;
   a download module, electrically connected to the first node Q(n), configured to receive the AC signal Vnew and output a $(n+p)^{th}$-stage cascade signal ST(n+p);
   a pull-down maintaining module, electrically connected to the first node Q(n), configured to receive a first voltage signal VSS, an oscillation signal and the nth-stage scan signal G(n) and to maintain a low voltage level of the first node Q(n);
   a pull-down module, electrically connected to the first node Q(n), configured to receive the first voltage signal VSS and a $(n+p+1)^{th}$-stage scan signal G(n+p+1) and to pull down a voltage level of the first node Q(n) and a voltage level of the nth-stage scan signal G(n); and
   a bootstrap capacitor, electrically connected to the first node Q(n), configured to receive the $n^{th}$-stage scan signal G(n),
   wherein the AC signal Vnew is a square wave of which a first voltage level is 28V and a second voltage level is −28V, and the second voltage level corresponds a blank time of a scan signal.

2. The GOA circuit of claim 1, wherein the pull-up control module comprises a control transistor, having a gate receiving the $(n-p)^{th}$-stage cascade signal ST(n-p), a first electrode receiving the $(n-p)^{th}$-stage scan signal G(n-p), and a second electrode electrically connected to the first node Q(n).

3. The GOA circuit of claim 1, wherein the pull-up module comprises a pull-up transistor having a gate electrically connected to the first node Q(n), a first electrode receiving the AC signal Vnew, and a second electrode outputting the $n^{th}$-stage scan signal G(n).

4. The GOA circuit of claim 1, wherein the download module comprises a download transistor, having a gate electrically connected to the first node Q(n), a first electrode receiving the AC signal Vnew, and a second electrode outputting the $(n+p)^{th}$-stage cascade signal ST(n+p).

5. The GOA circuit of claim 1, wherein the pull-down maintaining module comprises:
   a first maintaining unit, electrically connected to the first node Q(n), configured to receive the first oscillation signal LC1, the first voltage signal VSS and the $n^{th}$-stage scan signal G(n); and
   a second maintaining unit, electrically connected to the first node Q(n), configured to receive a second oscillation signal LC2, the first voltage level signal VSS and the $n^{th}$-stage scan signal G(n);
   wherein the oscillation signal comprises the first oscillation signal and the second oscillation signal.

6. The GOA circuit of claim 5, wherein the first oscillation signal LC1 and the second oscillation signal LC2 are both square waves and the first oscillation signal LC1 is a reverse signal of the second oscillation signal LC2.

7. The GOA circuit of claim 1, wherein the pull-down module comprises:
   a first pull-down transistor, having a gate receiving the $(n+p+1)^{th}$-stage scan signal G(n+p+1), a first electrode configured to pull down a voltage level of the $n^{th}$-stage scan signal G(n) and a second electrode receiving the first voltage level VSS; and
   a second pull-down transistor, having a gate receiving the $(n+p+1)^{th}$-stage scan signal G(n+p+1), a first electrode configured to pull down a voltage level of the first node Q(n) and a second electrode receiving the first voltage level VSS.

8. A display panel, comprising an array substrate, the array substrate having a gate driver on array (GOA) circuit, the GOA circuit comprising a plurality of GOA units connected in series, wherein an $n^{th}$-stage GOA unit controls a charging operation of an $n^{th}$-stage scan line, the $n^{th}$-stage GOA unit comprises:
   a pull-up control module, electrically connected to a first node Q(n), configured to receive a $(n-p)^{th}$-stage scan signal G(n-p) and a $(n-p)^{th}$-stage cascade signal ST(n-p) and to pull down or pull up a voltage level of the first node Q(n), wherein n and p are integers and n is larger than p;
   a pull-up module, electrically connected to the first node Q(n), configured to receive an alternating current (AC) signal Vnew and output a $n^{th}$-stage scan signal G(n), wherein a frequency of the AC signal Vnew is less than or equal to a predetermined frequency;
   a download module, electrically connected to the first node Q(n), configured to receive the AC signal Vnew and output a $(n+p)^{th}$-stage cascade signal ST(n+p);
   a pull-down maintaining module, electrically connected to the first node Q(n), configured to receive a first voltage signal VSS, an oscillation signal and the nth-stage scan signal G(n) and to maintain a low voltage level of the first node Q(n);
   a pull-down module, electrically connected to the first node Q(n), configured to receive the first voltage signal VSS and a $(n+p+1)^{th}$-stage scan signal G(n+p+1) and to pull down a voltage level of the first node Q(n) and a voltage level of the nth-stage scan signal G(n); and a bootstrap capacitor, electrically connected to the first node Q(n), configured to receive the $n^{th}$-stage scan signal G(n), wherein the AC signal Vnew is a square wave of which a first voltage level is 28V and a second voltage level is −28V, and the second voltage level corresponds a blank time of a scan signal.

9. The display panel of claim 8, wherein the pull-up control module comprises a control transistor, having a gate receiving the $(n-p)^{th}$-stage cascade signal ST(n-p), a first electrode receiving the $(n-p)^{th}$-stage scan signal G(n-p), and a second electrode electrically connected to the first node Q(n).

10. The display panel of claim 8, wherein the pull-up module comprises a pull-up transistor having a gate electrically connected to the first node Q(n), a first electrode receiving the AC signal Vnew, and a second electrode outputting the $n^{th}$-stage scan signal G(n).

11. The display panel of claim 8, wherein the download module comprises a download transistor, having a gate electrically connected to the first node Q(n), a first electrode receiving the AC signal Vnew, and a second electrode outputting the $(n+p)^{th}$-stage cascade signal ST(n+p).

12. The display panel of claim 8, wherein the pull-down maintaining module comprises:

a first maintaining unit, electrically connected to the first node Q(n), configured to receive the first oscillation signal LC1, the first voltage signal VSS and the $n^{th}$-stage scan signal G(n); and a second maintaining unit, electrically connected to the first node Q(n), configured to receive a second oscillation signal LC2, the first voltage level signal VSS and the $n^{th}$-stage scan signal G(n);

wherein the oscillation signal comprises the first oscillation signal and the second oscillation signal.

13. The display panel of claim 12, wherein the first oscillation signal LC1 and the second oscillation signal LC2 are both square waves and the first oscillation signal LC1 is a reverse signal of the second oscillation signal LC2.

14. The display panel of claim 8, wherein the pull-down module comprises:

a first pull-down transistor, having a gate receiving the $(n+p+1)^{th}$-stage scan signal G(n+p+1), a first electrode configured to pull down a voltage level of the $n^{th}$-stage scan signal G(n) and a second electrode receiving the first voltage level VSS; and a second pull-down transistor, having a gate receiving the $(n+p+1)^{th}$-stage scan signal G(n+p+1), a first electrode configured to pull down a voltage level of the first node Q(n) and a second electrode receiving the first voltage level VSS.

15. The display panel of claim 8 being a liquid crystal display panel or an organic light emitting diode display panel.

* * * * *